United States Patent
Philipp et al.

(10) Patent No.: US 7,577,023 B2
(45) Date of Patent: Aug. 18, 2009

(54) MEMORY INCLUDING WRITE CIRCUIT FOR PROVIDING MULTIPLE RESET PULSES

(75) Inventors: Jan Boris Philipp, Peekskill, NY (US); Thomas Happ, Tarrytown, NY (US); Thomas Nirschl, Essex Junction, VT (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/744,487

(22) Filed: May 4, 2007

(65) Prior Publication Data

US 2008/0273371 A1 Nov. 6, 2008

(51) Int. Cl.
*G11C 11/00* (2006.01)

(52) U.S. Cl. .................................... 365/163; 365/148

(58) Field of Classification Search ................. 365/163, 365/148

See application file for complete search history.

(56) References Cited

U.S. PATENT DOCUMENTS

| | | | |
|---|---|---|---|
| 4,225,946 A * | 9/1980 | Neale et al. | 365/163 |
| 6,487,113 B1 * | 11/2002 | Park et al. | 365/163 |
| 7,031,181 B1 * | 4/2006 | Happ | 365/148 |
| 7,042,760 B2 | 5/2006 | Hwang et al. | |
| 7,110,286 B2 | 9/2006 | Choi et al. | |
| 7,149,103 B2 * | 12/2006 | Ahn | 365/148 |
| 7,295,464 B2 * | 11/2007 | Cho et al. | 365/163 |
| 7,324,371 B2 * | 1/2008 | Khouri et al. | 365/163 |
| 7,382,647 B1 * | 6/2008 | Gopalakrishnan | 365/163 |
| 2005/0117387 A1 | 6/2005 | Hwang et al. | |
| 2005/0169093 A1 | 8/2005 | Choi et al. | |
| 2006/0221679 A1 * | 10/2006 | Kang et al. | 365/163 |
| 2006/0274574 A1 | 12/2006 | Choi et al. | |
| 2007/0206410 A1 * | 9/2007 | Sutardja | 365/163 |
| 2007/0253242 A1 * | 11/2007 | Parkinson et al. | 365/163 |
| 2008/0151612 A1 * | 6/2008 | Pellizzer et al. | 365/163 |

OTHER PUBLICATIONS

Stefan Lai, et al., "OUM—A 180 nm Nonvolatile Memory Cell Element Technology for Stand Alone and Embedded Applications", Intel Corporation,.
Y.N. Hwang, et al., "Phase-Change Chalcogenide Nonvolatile RAM Completely Based on CMOS Technology", IEEE, 2003.
S.J. Ahn, et al., "Highly Manufacturable High Density Phase Change Memory of 64 Mb and Beyond", IEEE, 2004.
Sangbeom Kang, et al., "A .1um 1.8V 256Mb 66 MHz Synchronous Burst PRAM", IEEE, 2006.

* cited by examiner

*Primary Examiner*—Huan Hoang
(74) *Attorney, Agent, or Firm*—Dicke, Billig & Czaja, PLLC

(57) ABSTRACT

An integrated circuit includes an array of resistive memory cells having varying critical dimensions and a write circuit. The write circuit is configured to reset a selected memory cell by applying a first pulse having a first amplitude and a second pulse having a second amplitude less than the first amplitude to the selected memory cell.

24 Claims, 5 Drawing Sheets

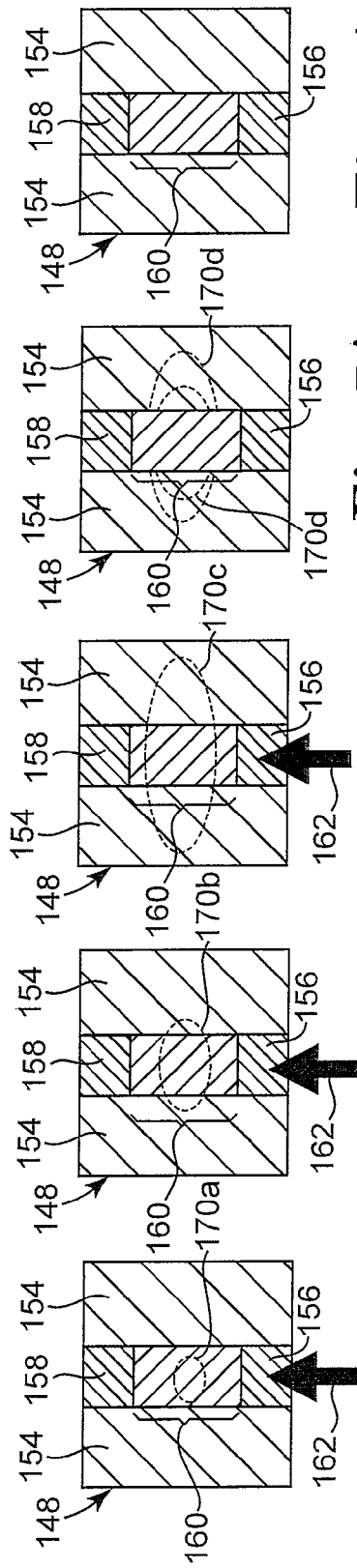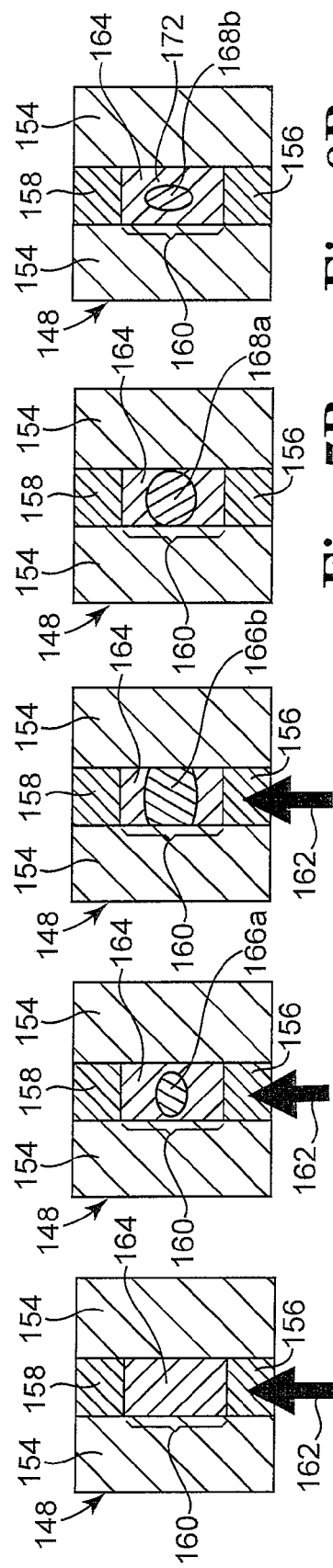

United States Patent

MEMORY INCLUDING WRITE CIRCUIT FOR PROVIDING MULTIPLE RESET PULSES

BACKGROUND

One type of memory is resistive memory. Resistive memory utilizes the resistance value of a memory element to store one or more bits of data. For example, a memory element programmed to have a high resistance value may represent a logic "1" data bit value and a memory element programmed to have a low resistance value may represent a logic "0" data bit value. Typically, the resistance value of the memory element is switched electrically by applying a voltage pulse or a current pulse to the memory element.

One type of resistive memory is phase change memory. Phase change memory uses a phase change material in the resistive memory element. The phase change material exhibits at least two different states. The states of the phase change material may be referred to as the amorphous state and the crystalline state, where the amorphous state involves a more disordered atomic structure and the crystalline state involves a more ordered lattice. The amorphous state usually exhibits higher resistivity than the crystalline state. Also, some phase change materials exhibit multiple crystalline states, e.g. a face-centered cubic (FCC) state and a hexagonal closest packing (HCP) state, which have different resistivities and may be used to store bits of data. In the following description, the amorphous state generally refers to the state having the higher resistivity and the crystalline state generally refers to the state having the lower resistivity.

Phase changes in the phase change materials may be induced reversibly. In this way, the memory may change from the amorphous state to the crystalline state and from the crystalline state to the amorphous state in response to temperature changes. The temperature changes to the phase change material may be achieved by driving current through the phase change material itself or by driving current through a resistive heater adjacent the phase change material. With both of these methods, controllable heating of the phase change material causes controllable phase change within the phase change material.

A phase change memory including a memory array having a plurality of memory cells that are made of phase change material may be programmed to store data utilizing the memory states of the phase change material. One way to read and write data in such a phase change memory device is to control a current and/or a voltage pulse that is applied to the phase change material. The level of current and/or voltage generally corresponds to the temperature induced within the phase change material in each memory cell.

To achieve higher density phase change memories, a phase change memory cell can store multiple bits of data. Multi-bit storage in a phase change memory cell can be achieved by programming the phase change material to have intermediate resistance values or states, where the multi-bit or multilevel phase change memory cell can be written to more than two states. If the phase change memory cell is programmed to one of three different resistance levels, 1.5 bits of data per cell can be stored. If the phase change memory cell is programmed to one of four different resistance levels, two bits of data per cell can be stored, and so on. To program a phase change memory cell to an intermediate resistance value, the amount of crystalline material coexisting with amorphous material and hence the cell resistance is controlled via a suitable write strategy.

The critical dimension (CD) of phase change memory cells within a memory array typically varies due to variations in fabrication processes such as lithography. In addition, one or more phase change memory cells within a memory array may include structural defects. The variation in critical dimension and/or the structural defects may result in variations in the current and/or voltage required to transition a phase change memory cell from the crystalline state to an amorphous state.

For these and other reasons, there is a need for the present invention.

SUMMARY

One embodiment provides an integrated circuit. The integrated circuit includes an array of resistive memory cells having varying critical dimensions and a write circuit. The write circuit is configured to reset a selected memory cell by applying a first pulse having a first amplitude and a second pulse having a second amplitude less than the first amplitude to the selected memory cell.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 4A illustrates a cross-sectional view of one embodiment of initial heating of a phase change memory cell in response to a reset signal.

FIG. 4B illustrates a cross-sectional view of one embodiment of the phase change memory cell in response to the initial heating.

FIG. 5A illustrates a cross-sectional view of one embodiment of subsequent heating of the phase change memory cell in response to the reset signal.

FIG. 5B illustrates a cross-sectional view of one embodiment of the phase change memory cell in response to the subsequent heating.

FIG. 6A illustrates a cross-sectional view of one embodiment of additional subsequent heating of the phase change memory cell in response to the reset signal.

FIG. 6B illustrates a cross-sectional view of one embodiment of the phase change memory cell in response to the additional subsequent heating.

FIG. 7A illustrates a cross-sectional view of one embodiment of initial cooling of the phase change memory cell in response to removing the reset signal.

FIG. 7B illustrates a cross-sectional view of one embodiment of the phase change memory cell in response to the initial cooling.

FIG. 8A illustrates a cross-sectional view of one embodiment of subsequent cooling of the phase change memory cell with the reset signal removed.

FIG. 8B illustrates a cross-sectional view of one embodiment of the phase change memory cell in response to the subsequent cooling.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1A:
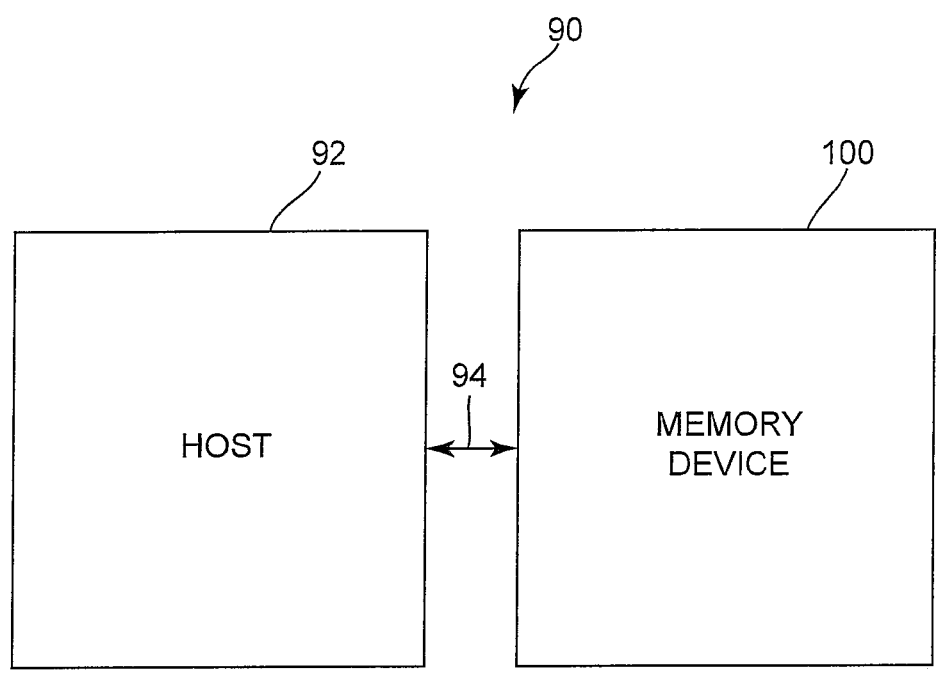
FIG. 1A is a block diagram illustrating one embodiment of a system.

FIG. 1A is a block diagram illustrating one embodiment of a system 90. System 90 includes a host 92 and a memory device 100. Host 92 is communicatively coupled to memory device 100 through communication link 94. Host 92 includes a computer (e.g., desktop, laptop, handheld), portable electronic device (e.g., cellular phone, personal digital assistant (PDA), MP3 player, video player), or any other suitable device that uses memory. Memory device 100 provides memory for host 92. In one embodiment, memory device 100 includes a phase change memory device or other suitable resistive or resistivity changing memory device.

Figure 1B:
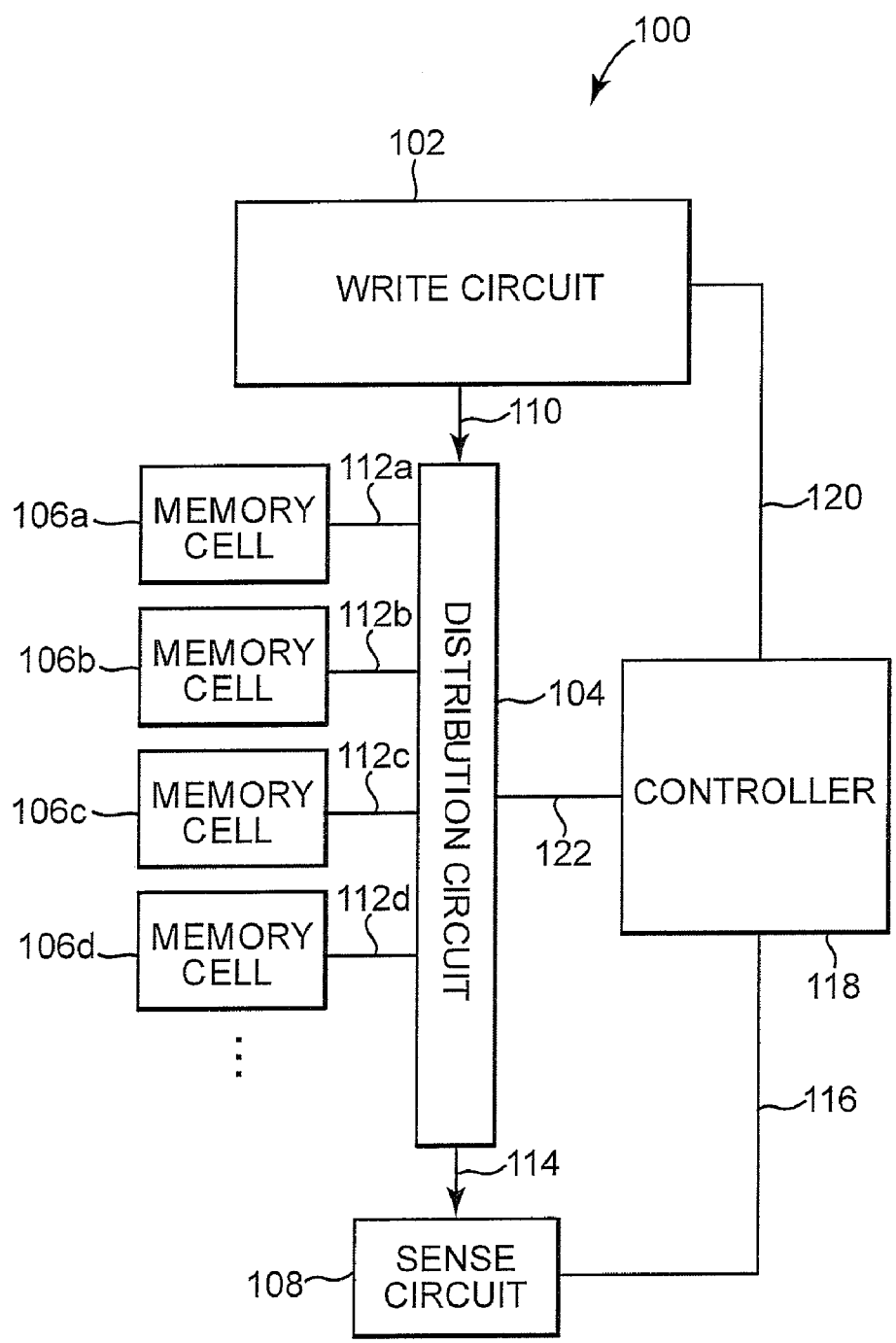
FIG. 1B is a block diagram illustrating one embodiment of a memory device.

FIG. 1B is a block diagram illustrating one embodiment of memory device 100. Memory device 100 includes a write circuit 102, a distribution circuit 104, memory cells 106a, 106b, 106c, and 106d, a controller 118, and a sense circuit 108. Each of the memory cells 106a-106d is a phase change memory cell that stores data based on the amorphous and crystalline states of phase change material in the memory cell. Also, each of the memory cells 106a-106d can be programmed into one of two or more states by programming the phase change material to have intermediate resistance values. To program one of the memory cells 106a-106d to an intermediate resistance value, the amount of crystalline material coexisting with amorphous material, and hence the cell resistance, is controlled using a suitable write strategy.

Write circuit 102 provides two or more pulses having decreasing amplitudes to reset memory cells 106a-106d. The first pulse resets memory cells having the largest critical dimension but may result in partial recrystallization of memory cells having a critical dimension less than the largest critical dimension. The next pulse, which has a smaller amplitude than the first pulse, resets memory cells having the next largest critical dimension but may result in partial recrystallization of memory cells having a critical dimension less than the next largest critical dimension. Write circuit 102 provides the two or more pulses such that memory cells having the smallest critical dimension are reset without recrystallization in response to the last pulse in the sequence of pulses.

As used herein, the term "electrically coupled" is not meant to mean that the elements must be directly coupled together and intervening elements may be provided between the "electrically coupled" elements.

Write circuit 102 is electrically coupled to distribution circuit 104 though signal path 110. Distribution circuit 104 is electrically coupled to each of the memory cells 106a-106d through signal paths 112a-112d. Distribution circuit 104 is electrically coupled to memory cell 106a through signal path 112a. Distribution circuit 104 is electrically coupled to memory cell 106b through signal path 112b. Distribution circuit 104 is electrically coupled to memory cell 106c through signal path 112c. Distribution circuit 104 is electrically coupled to memory cell 106d through signal path 112d. Distribution circuit 104 is electrically coupled to sense circuit 108 through signal path 114. Sense circuit 108 is electrically coupled to controller 118 through signal path 116. Controller 118 is electrically coupled to write circuit 102 through signal path 120 and to distribution circuit 104 through signal path 122.

Each of the memory cells 106a-106d includes a phase change material that may be changed from an amorphous state to a crystalline state or from a crystalline state to an amorphous state under the influence of temperature change. The amount of crystalline phase change material coexisting with amorphous phase change material in one of the memory cells 106a-106d thereby defines two or more states for storing data within memory device 100.

In the amorphous state, a phase change material exhibits significantly higher resistivity than in the crystalline state. Therefore, the two or more states of memory cells 106a-106d differ in their electrical resistivity. In one embodiment, the two or more states include two states and a binary system is used, wherein the two states are assigned bit values of "0" and "1". In another embodiment, the two or more states include three states and a ternary system is used, wherein the three states are assigned bit values of "0", "1", and "2". In another embodiment, the two or more states include four states that are assigned multi-bit values, such as "00", "01", "10", and "11". In other embodiments, the two or more states can be any suitable number of states in the phase change material of a memory cell.

Controller 118 controls the operation of write circuit 102, sense circuit 108, and distribution circuit 104. Controller 118 includes a microprocessor, microcontroller, or other suitable logic circuitry for controlling the operation of write circuit 102, sense circuit 108, and distribution circuit 104. Controller 118 controls write circuit 102 for setting the resistance states of memory cells 106a-106d. Controller 118 controls sense circuit 108 for reading the resistance states of memory cells 106a-106d. Controller 118 controls distribution circuit 104 for selecting memory cells 106a-106d for read or write access. In one embodiment, controller 118 is embedded on the same chip as memory cells 106a-106d. In another embodiment, controller 118 is located on a separate chip from memory cells 106a-106d.

In one embodiment, write circuit 102 provides voltage pulses to distribution circuit 104 through signal path 110, and distribution circuit 104 controllably directs the voltage pulses to memory cells 106a-106d through signal paths 112a-112d. In another embodiment, write circuit 102 provides current pulses to distribution circuit 104 through signal path 110, and distribution circuit 104 controllably directs the current pulses to memory cells 106a-106d through signal paths 112a-112d. In one embodiment, distribution circuit 104 includes a plurality of transistors that controllably direct the voltage pulses or the current pulses to each of the memory cells 106a-106d.

Sense circuit 108 reads each of the two or more states of memory cells 106a-106d through signal path 114. Distribution circuit 104 controllably directs read signals between sense circuit 108 and memory cells 106a-106d through signal paths 112a-112d. In one embodiment, distribution circuit 104 includes a plurality of transistors that controllably direct read signals between sense circuit 108 and memory cells 106a-106d.

In one embodiment, to read the resistance of one of the memory cells 106a-106d, sense circuit 108 provides current that flows through one of the memory cells 106a-106d and sense circuit 108 reads the voltage across that one of the memory cells 106a-106d. In another embodiment, sense circuit 108 provides voltage across one of the memory cells 106a-106d and reads the current that flows through that one of the memory cells 106a-106d. In another embodiment, write circuit 102 provides voltage across one of the memory cells 106a-106d and sense circuit 108 reads the current that flows through that one of the memory cells 106a-106d. In another embodiment, write circuit 102 provides current through one of the memory cells 106a-106d and sense circuit 108 reads the voltage across that one of the memory cells 106a-106d. In another embodiment, a bit line coupled to a memory cell 106a-106d is pre-charged to an initial bias and subsequently discharged by the memory cell 106a-106d. The difference compared to the initial pre-charge bias is used to evaluate the data stored by the memory cell 106a-106d. In one embodiment, the bias on a word line coupled to the memory cell 106a-106d is used to determine the resistance of the memory cell 106a-106d.

To program a memory cell 106a-106d within memory device 100, write circuit 102 generates one or more current or voltage pulses for heating the phase change material in the target memory cell. In one embodiment, write circuit 102 generates one or more appropriate current or voltage pulses, which are fed into distribution circuit 104 and distributed to the appropriate target memory cell 106a-106d. The amplitudes and durations of the one or more current or voltage pulses are controlled depending on whether the memory cell is being set or reset. Generally, a "set" operation of a memory cell is heating the phase change material of the target memory cell above its crystallization temperature (but below its melting temperature) long enough to achieve the crystalline state or a partially crystalline and partially amorphous state. Generally, a "reset" operation of a memory cell is heating the phase change material of the target memory cell above its melting temperature, and then quickly quench cooling the material, thereby achieving the amorphous state or a partially amorphous and partially crystalline state.

Figures 2A, 2B, 2C, 3:
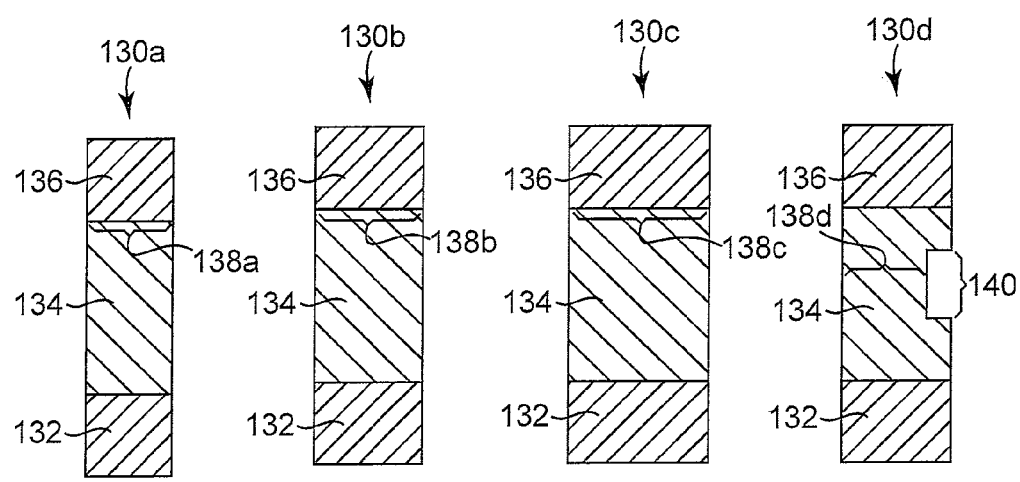
FIG. 2A illustrates a cross-sectional view of one embodiment of a phase change memory cell having a first critical dimension.
FIG. 2B illustrates a cross-sectional view of another embodiment of a phase change memory cell having a second critical dimension.
FIG. 2C illustrates a cross-sectional view of another embodiment of a phase change memory cell having a third critical dimension.
FIG. 3 illustrates a cross-sectional view of another embodiment of a phase change memory cell having a structural defect.

FIG. 2A illustrates a cross-sectional view of one embodiment of a phase change memory cell 130a having a first critical dimension 138a. Critical dimension 138a defines the minimum cross-section through memory cell 130a and therefore the current used to reset phase change memory cell 130a to an amorphous state. Phase change memory cell 130a includes a first electrode 132, a second electrode 136, and phase change material 134. Phase change material 134 is electrically coupled at one end to first electrode 132 and at the other end to second electrode 136. Read and write signals are provided to phase change material 134 via first electrode 132 and second electrode 136. During a write operation, the current path through phase change material 134 is from one of first electrode 132 and second electrode 136 to the other of first electrode 132 and second electrode 136. In one embodiment, each of the phase change memory cells 106a-106d is similar to phase change memory cell 130a. Phase change memory cell 130a provides a storage location for storing one or more bits of data.

First electrode 132 and second electrode 136 can be any suitable electrode material, such as TiN, TaN, W, Al, Ti, Ta, TiSiN, TaSiN, TiAlN, TaAlN, or Cu. Phase change material 134 may be made up of a variety of materials in accordance with the present invention. Generally, chalcogenide alloys that contain one or more elements from group VI of the periodic table are useful as such materials. In one embodiment, phase change material 134 of phase change memory cell 130a is made up of a chalcogenide compound material, such as GeSbTe, SbTe, GeTe, or AgInSbTe. In another embodiment, phase change material 134 is chalcogen free, such as GeSb, GaSb, InSb, or GeGaInSb. In other embodiments, phase change material 134 is made up of any suitable material including one or more of the elements Ge, Sb, Te, Ga, As, In, Se, and S.

FIG. 2B illustrates a cross-sectional view of another embodiment of a phase change memory cell 130b having a second critical dimension 138b. Phase change memory cell 130b is similar to phase change memory cell 130a previously described and illustrated with reference to FIG. 2A except that phase change memory cell 130b has a different critical dimension than phase change memory cell 130a. In one embodiment, critical dimension 138b is greater than critical dimension 138a. Critical dimension 138b defines the minimum cross-section though memory cell 130b and therefore the current used to reset phase change memory cell 130b to an amorphous state. Since critical dimension 138b is greater than critical dimension 138a, the current used to reset phase change memory cell 130b to an amorphous state is greater than the current used to reset phase change memory cell 130a to the amorphous state.

FIG. 2C illustrates a cross-sectional view of another embodiment of a phase change memory cell 130c having a third critical dimension 138c. Phase change memory cell 130c is similar to phase change memory cell 130a previously described and illustrated with reference to FIG. 2A except that phase change memory cell 130c has a different critical dimension than phase change memory cell 130a and phase change memory cell 130b. In one embodiment, critical dimension 138c is greater than critical dimension 138b. Critical dimension 138c defines the minimum cross-section though memory cell 130c and therefore the current used to reset phase change memory cell 130c to an amorphous state. Since critical dimension 138c is greater than critical dimension 138b, the current used to reset phase change memory cell 130c to the amorphous state is greater than the current used to reset phase change memory cell 130b to the amorphous state.

FIG. 3 illustrates a cross-sectional view of another embodiment of a phase change memory cell 130d having a structural defect 140. Phase change memory cell 130d is similar to phase change memory cell 130a previously described and illustrated with reference to FIG. 2A except that phase change memory cell 130d has structural defect 140. Structural defect 140 defines the minimum cross-section 138d through phase change memory cell 130d and therefore the current used to reset phase change memory cell 130d to an amorphous state. Structural defect 140 can be located at the edge, interface, or center of phase change material 134. As indicated in FIGS. 2A-2C and 3, as the minimum cross-section as indicated at 138a-138d in phase change memory cells 130a-130d varies, the current used to reset the phase change memory cell also varies.

FIG. 4A illustrates a cross-sectional view of one embodiment of initial heating of a phase change memory cell 148 in response to a reset signal 162. Phase change memory cell 148 includes dielectric material 154, a first electrode 156, phase change material 160, and a second electrode 158. Phase change material 160 is electrically coupled at one end to first electrode 156 and at the other end to second electrode 158. Dielectric material 154 laterally surrounds first electrode 156, phase change material 160, and second electrode 158. Dielectric material 154 can be any suitable dielectric material, such as $SiO_2$, $SiO_x$, SiN, fluorinated silica glass (FSG), boro-phosphorous silicate glass (BPSG), boro-silicate glass (BSG), or low-k material.

Reset signal 162 is applied by write circuit 102 to first electrode 156 and through phase change material 160 to second electrode 158. In one embodiment, reset signal 162 is a current signal. In another embodiment, reset signal 162 is a voltage signal. In another embodiment, reset signal 162 is a combination of voltage and current pulses. In response to reset signal 162, a first portion of phase change material 160 begins to heat as indicated at 170a.

FIG. 4B illustrates a cross-sectional view of one embodiment of phase change memory cell 148 in response to the initial heating as indicated at 170a in FIG. 4A. Before the initial heating and during the initial heating, phase change material 160 remains in a crystalline state as indicated at 164.

FIG. 5A illustrates a cross-sectional view of one embodiment of subsequent heating of phase change memory cell 148 in response to reset signal 162. With reset signal 162 continuing to be applied, a larger portion of phase change material 160 and a first portion of dielectric material 154 are heated as indicated at 170b.

FIG. 5B illustrates a cross-sectional view of one embodiment of phase change memory cell 148 in response to the subsequent heating as indicated at 170b in FIG. 5A. In response to the subsequent heating, a first portion of phase change material 160 becomes molten as indicated at 166a. The portions of phase change material 160 that do not become molten remain in the crystalline state as indicated at 164.

FIG. 6A illustrates a cross-sectional view of one embodiment of additional subsequent heating of phase change memory cell 148 in response to reset signal 162. With reset signal 162 continuing to be applied, yet a larger portion of phase change material 162 and a larger portion of dielectric material 154 are heated as indicated at 170c.

FIG. 6B illustrates a cross-sectional view of one embodiment of phase change memory cell 148 in response to the additional subsequent heating as indicated at 170c in FIG. 6A. In response to the additional subsequent heating, a larger portion of phase change material 160 becomes molten as indicated at 166b. The portions of phase change material 160 that do not become molten remain in the crystalline state as indicated at 164.

FIG. 7A illustrates a cross-sectional view of one embodiment of initial cooling of phase change memory cell 148 in response to removing reset signal 162. In response to removing reset signal 162, phase change material 160 is quickly cooled while portions of insulation material 154 remain heated as indicated at 170d.

FIG. 7B illustrates a cross-sectional view of one embodiment of phase change memory cell 148 in response to the initial cooling as indicated in FIG. 7A. In response to the initial cooling, molten portion 166b quench cools into the amorphous state as indicated at 168a. The portions of phase change material 160 that did not become molten remain in the crystalline state as indicated at 164.

FIG. 8A illustrates a cross-sectional view of one embodiment of phase change memory cell 148 after subsequent cooling of phase change memory cell 148 with reset signal 162 removed. In response to reset signal 162 being removed, the heating as indicated at 170d in FIG. 7A dissipates.

FIG. 8B illustrates a cross-sectional view of one embodiment of phase change memory cell 148 in response to the subsequent cooling as indicated in FIG. 8A. The heat remaining in dielectric material 154 before its dissipation after removing reset signal 162 results in recrystallization of a portion of phase change memory cell 160 as indicated at 172. This recrystallization occurs in response to reset signal 162 overheating dielectric material 154. Overheating of dielectric material 154 increases as the critical dimension of phase change memory cell 148 decreases or as structural defects reduce the minimum cross-section through phase change material 160. For memory cells having the largest. critical dimension this overheating does not occur. For memory cells having a smaller critical dimension or a structural defect, however, this recrystallization may occur and provide an undesired resistance value and/or reduce the retention time of the memory cell.

Figure 9:
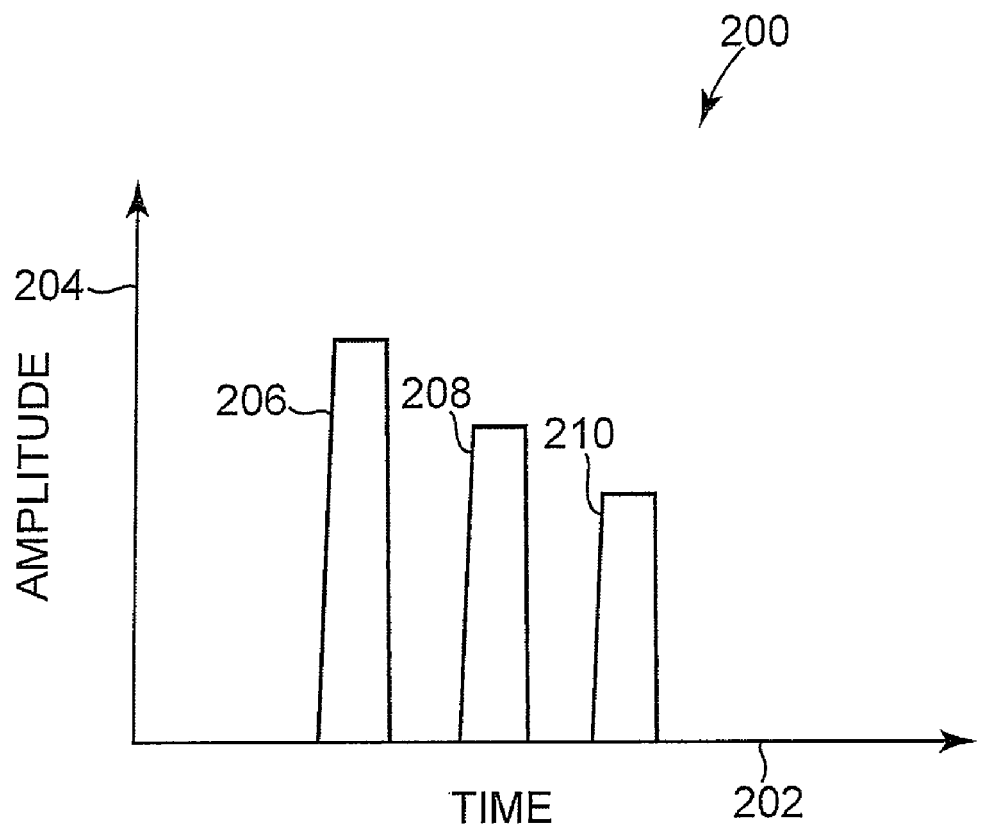
FIG. 9 is a graph illustrating one embodiment of multiple reset pulses for resetting a phase change memory cell.

FIG. 9 is a graph 200 illustrating one embodiment of multiple reset pulses for resetting a phase change memory cell to overcome the recrystallization described above with reference to FIG. 8B. Graph 200 includes time on x-axis 202 and pulse amplitude on y-axis 204. To reset a phase change memory cell, write circuit 102 applies a first pulse as indicated at 206, a second pulse as indicated at 208, and optionally a third pulse as indicated at 210. In other embodiments, write circuit 102 applies any suitable number of pulses to the selected memory cell to reset the memory cell. The sequence of two or more pulses have decreasing amplitudes. Between each pulse the memory cell is allowed to cool.

First pulse 206 has a first amplitude. Second pulse 208 has a second amplitude less than the first amplitude, and third pulse 210 has a third amplitude less than the second amplitude. Pulse 206 resets the memory cell without recrystallization of the phase change material if the memory cell has the largest critical dimension (e.g., memory cell 130c illustrated in FIG. 2C). Pulse 206, however, may result in recrystallization of a portion of the phase change material if the memory cell has a smaller critical dimension (e.g., memory cell 130a illustrated in FIG. 2A or memory cell 130b illustrated in FIG. 2B).

Reset pulse 208 does not have an amplitude large enough to reset the memory cell if pulse 206 reset the memory cell without recrystallization (e.g., reset pulse 206 will not reset previously reset memory cell 130c illustrated in FIG. 2C). Pulse 208 resets the memory cell without recrystallization of the phase change material if the memory cell has a critical dimension less than the largest critical dimension (e.g., memory cell 130b illustrated in FIG. 2B). Pulse 208, however, may result in recrystallization of a portion of the phase change material if the memory cell has an even smaller critical dimension (e.g., memory cell 130a illustrated in FIG. 2A).

Reset pulse 210 does not have an amplitude large enough to reset the memory cell if pulse 206 or 208 reset the memory cell without recrystallization (e.g., reset pulse 210 will not reset previously reset memory cell 130b illustrated in FIG. 2B or memory cell 130c illustrated in FIG. 2C). Pulse 210 resets the memory cell without recrystallization if the memory cell has a yet even smaller critical dimension (e.g., memory cell 130a illustrated in FIG. 2A). In one embodiment, any suitable number of additional reset pulses with decreasing amplitudes is applied to reset the memory cell. The last reset pulse in the sequence of reset pulses will reset the memory cell without recrystallization if the memory cell has the smallest critical dimension. In this way, no matter what the minimum cross-section through the memory cell happens to be, at least one of the applied reset pulses will reset the memory cell without substantial recrystallization.

Embodiments of the present invention provide a write circuit for resetting a phase change memory cell by applying a sequence of reset pulses with decreasing amplitudes to the phase change memory cell. The sequence of reset pulses ensures that at least one of the pulses will reset the selected memory cell without substantial recrystallization.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. An integrated circuit comprising:
    an array of resistive memory cells having varying critical dimensions; and
    a write circuit configured to reset a selected memory cell by applying a first pulse having a first amplitude and a second pulse having a second amplitude less than the first amplitude to the selected memory cell,
    wherein the write circuit is configured to provide a delay between the first pulse and the second pulse.

2. The integrated circuit of claim 1, wherein the resistive memory cells comprise phase change memory cells.

3. The integrated circuit of claim 2, wherein the phase change memory cells comprise a phase change material including at least one of Ge, Sb, Te, Ga, As, In, Se, and S.

4. The integrated circuit of claim 1, wherein the write circuit is configured to reset the selected memory cell by applying the first pulse, the second pulse, and a third pulse having a third amplitude less than the second amplitude to the selected memory cell.

5. The integrated circuit of claim 1, wherein the first pulse is configured to reset memory cells having a first critical dimension and the second pulse is configured to reset memory cells having a second critical dimension less than the first critical dimension.

6. The integrated circuit of claim 5, wherein the first pulse is configured to reset memory cells having the first critical dimension without recrystallization of memory cells having the first critical dimension and the second pulse is configured to reset memory cells having the second critical dimension without recrystallization of memory cells having the second critical dimension.

7. A system comprising:
    a host; and
    a memory device communicatively coupled to the host, the memory device comprising:
        an array of phase change memory cells having varying critical dimensions;
        a write circuit configured to reset a selected memory cell by applying a first pulse having a first amplitude and a second pulse having a second amplitude less than the first amplitude;
        a sense circuit configured to sense a resistance state of a selected memory cell; and
        a distribution circuit configured to pass signals between the memory cells, the write circuit, and the sense circuit,
        wherein the write circuit is configured to provide a delay between the first pulse and the second pulse.

8. The system of claim 7, wherein the write circuit is configured to reset the selected memory cell by applying the first pulse, the second pulse, and a third pulse having a third amplitude less than the second amplitude to the selected memory cell.

9. The system of claim 7, wherein each memory cell comprises:
    a first electrode;
    a second electrode; and
    phase change material between the first electrode and the second electrode.

10. The system of claim 7, wherein the memory device further comprises:
    a controller for controlling the write circuit, the sense circuit, and the distribution circuit.

11. An integrated circuit comprising:
    an array of phase change memory cells having varying critical dimensions; and
    means for resetting a selected memory cell without recrystallization independent of a critical dimension and structural defect of the selected memory cell.

12. The integrated circuit of claim 11, wherein the means for resetting the selected memory cell comprises:
    means for applying a first pulse having a first amplitude to the selected memory cell; and
    means for applying a second pulse having a second amplitude less than the first amplitude to the selected memory cell.

13. The integrated circuit of claim 12, wherein the means for resetting the selected memory cell comprises:
    means for applying a third pulse having a third amplitude less than the second amplitude to the selected memory cell.

14. A method for writing to a memory, the method comprising:
    providing an array of phase change memory cells having varying critical dimensions; and
    resetting a selected memory cell by:
        applying a first pulse having a first amplitude to the selected memory cell;
        cooling the selected memory cell after the first pulse; and
        applying a second pulse having a second amplitude less than the first amplitude to the selected memory cell after cooling the selected memory cell.

15. The method of claim 14, wherein resetting the selected memory cell comprises:
    applying a third pulse having a third amplitude less than the second amplitude to the selected memory cell.

16. The method of claim 14, wherein applying the first pulse comprises applying the first pulse to reset the selected memory cell having a first critical dimension, and wherein applying the second pulse comprises applying the second pulse to reset the selected memory cell having a second critical dimension less than the first critical dimension.

17. The method of claim 14, wherein applying the first pulse comprises applying a first current pulse, and wherein applying the second pulse comprises applying a second current pulse.

18. The method of claim 14, wherein applying the first pulse comprises applying a first voltage pulse, and wherein applying the second pulse comprises applying a second voltage pulse.

19. A method for resetting a memory cell, the method comprising:

applying a first pulse to the memory cell, the first pulse resetting the memory cell without recrystallization if the memory cell has a first critical dimension;

cooling the memory cell after the first pulse; and applying a second pulse to the memory cell after cooling the memory cell, the second pulse resetting the memory cell without recrystallization if the memory cell has a second critical dimension less than the first critical dimension.

20. The method of claim 19, further comprising:

applying a third pulse to the memory cell, the third pulse resetting the memory cell without recrystallization if the memory cell has a third critical dimension less than the second critical dimension.

21. The method of claim 19, wherein applying the first pulse comprises applying the first pulse having a first amplitude, and wherein applying the second pulse comprises applying the second pulse having a second amplitude less than the first amplitude.

22. The method of claim 19, wherein applying the first pulse comprises applying the first pulse to a phase change memory cell.

23. The method of claim 19, wherein applying the first pulse comprises applying a first current pulse, and wherein applying the second pulse comprises applying a second current pulse.

24. The method of claim 19, wherein applying the first pulse comprises applying a first voltage pulse, and wherein applying the second pulse comprises applying a second voltage pulse.

* * * * *